United States Patent
Yura et al.

(10) Patent No.: US 10,103,377 B2
(45) Date of Patent: Oct. 16, 2018

(54) METHOD FOR MANUFACTURING LITHIUM COBALTATE ORIENTED SINTERED PLATE

(71) Applicant: NGK INSULATORS, LTD., Nagoya-Shi (JP)

(72) Inventors: Yukinobu Yura, Nagoya (JP); Nobuyuki Kobayashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 314 days.

(21) Appl. No.: 15/073,769

(22) Filed: Mar. 18, 2016

(65) Prior Publication Data

US 2016/0211506 A1 Jul. 21, 2016

Related U.S. Application Data

(63) Continuation of application No. PCT/JP2015/076163, filed on Sep. 15, 2015.

(30) Foreign Application Priority Data

Sep. 30, 2014 (JP) ................................ 2014-201643
Mar. 18, 2015 (JP) ................................ 2015-054908

(51) Int. Cl.
H01M 4/04 (2006.01)
H01M 4/525 (2010.01)
(Continued)

(52) U.S. Cl.
CPC .......... *H01M 4/0471* (2013.01); *C01G 51/42* (2013.01); *C04B 35/01* (2013.01); *C30B 1/10* (2013.01);
(Continued)

(58) Field of Classification Search
CPC combination set(s) only.
See application file for complete search history.

(56) References Cited

U.S. PATENT DOCUMENTS

2008/0248400 A1 10/2008 Hwang et al.
2010/0159332 A1 6/2010 Sugiura et al.
(Continued)

FOREIGN PATENT DOCUMENTS

JP 2003-217582 A1 7/2003
JP 2004-196604 A1 7/2004
(Continued)

OTHER PUBLICATIONS

Wang et al., Structural and electrochemical characterizations of surface-modified LiCoO2 cathode materials for Li-ion batteries, 2002, Solid State Ionics 148, 335-342.*
(Continued)

*Primary Examiner* — Erin F Bergner
(74) *Attorney, Agent, or Firm* — Burr & Brown, PLLC

(57) ABSTRACT

Provided is a method for manufacturing a lithium cobaltate oriented sintered plate, comprising (a) providing a green sheet comprising $Co_3O_4$ particles, (b) firing the green sheet to form a $Co_3O_4$ oriented sintered plate, and (c) firing the sintered plate in the presence of a lithium source to introduce lithium and thereby form the lithium cobaltate oriented sintered plate composed of $LiCoO_2$, the method further comprising (d1) attaching a Mg-containing compound to the $Co_3O_4$ oriented sintered plate before the step (c) or (d2) attaching the Mg-containing compound to the lithium cobaltate oriented sintered plate after the step (c) to fire the sintered plate. According to the present invention, a lithium cobaltate oriented sintered plate can be manufactured in which grain boundaries in the plate thickness direction are significantly reduced and with which enhanced battery performance can be achieved when used as a positive electrode active material in lithium secondary batteries.

10 Claims, 4 Drawing Sheets

(51) Int. Cl.
  *C30B 1/10* (2006.01)
  *C30B 29/22* (2006.01)
  *C30B 29/64* (2006.01)
  *C01G 51/00* (2006.01)
  *C04B 35/01* (2006.01)
  *H01M 4/02* (2006.01)
  *H01M 4/131* (2010.01)

(52) U.S. Cl.
  CPC ............. *C30B 29/22* (2013.01); *C30B 29/64* (2013.01); *H01M 4/525* (2013.01); *C04B 2235/3203* (2013.01); *C04B 2235/3277* (2013.01); *C04B 2235/3298* (2013.01); *C04B 2235/5445* (2013.01); *C04B 2235/6025* (2013.01); *C04B 2235/616* (2013.01); *C04B 2235/6565* (2013.01); *C04B 2235/6585* (2013.01); *C04B 2235/661* (2013.01); *C04B 2235/787* (2013.01); *C04B 2235/85* (2013.01); *C04B 2235/9623* (2013.01); *H01M 4/131* (2013.01); *H01M 2004/028* (2013.01)

(56) References Cited

U.S. PATENT DOCUMENTS

2013/0101893 A1* 4/2013 Dai .................. H01M 10/0565
  429/163
2014/0124701 A1 5/2014 Vanhatalo et al.

FOREIGN PATENT DOCUMENTS

| JP | 2008-258133 A1 | 10/2008 |
| JP | 2014-523383 A1 | 9/2014 |
| WO | 2010/074304 A1 | 7/2010 |

OTHER PUBLICATIONS

English translation of the Written Opinion (Application No. PCT/JP2015/076163) of the International Search Authority dated Dec. 1, 2015.

International Search Report and Written Opinion (Application No. PCT/JP2015/076163) dated Dec. 1, 2015 (with English translation).

* cited by examiner

METHOD FOR MANUFACTURING LITHIUM COBALTATE ORIENTED SINTERED PLATE

CROSS-REFERENCE TO RELATED APPLICATIONS

This application is a continuation application of PCT/JP2015/76163 filed Sep. 15, 2015, which claims priority to Japanese Patent Application No. 2014-201643 filed Sep. 30, 2014 and Japanese Patent Application No. 2015-54908 filed Mar. 18, 2015, the entire contents all of which are incorporated herein by reference.

BACKGROUND OF THE INVENTION

1. Field of the Invention

The present invention relates to a method for manufacturing a lithium cobaltate oriented sintered plate.

2. Description of the Related Art

Positive electrode active materials including a lithium complex oxide (lithium transition metal oxide) having a layered rock-salt structure are widely known as positive electrode active materials in lithium secondary batteries (which may be referred to as lithium ion secondary batteries). It is known that, in positive electrode active materials of this type, lithium ions (Li$^+$) therein diffuse along an in-plane direction of the (003) plane (i.e., any direction in the plane parallel to the (003) plane), while intercalation and deintercalation of lithium ions occur through a crystal plane other than the (003) plane (e.g., the (101) plane or the (104) plane).

Accordingly, in positive electrode active materials of this type, attempts have been made to enhance battery characteristics of lithium secondary batteries by exposing a crystal plane through which lithium ions are favorably intercalated and deintercalated (i.e., a plane other than the (003) plane, such as the (101) plane or the (104) plane) to a surface which comes into contact with a larger amount of electrolyte. For example, Patent Document 1 (WO2010/074304) discloses the production of a LiCoO$_2$ oriented ceramic sheet (a positive electrode active material film) having the (104) plane parallel to the sheet surface, by firing a Co$_3$O$_4$-containing green sheet to form a sheet containing Co$_3$O$_4$ grains oriented such that the (h00) plane is directed in parallel with the sheet surface, and then introducing lithium. Moreover, this document further discloses the addition of Bi$_2$O$_3$ as a grain growth promoter to the Co$_3$O$_4$-containing green sheet.

CITATION LIST

Patent Documents

Patent Document 1: WO2010/074304

SUMMARY OF THE INVENTION

Actually produced LiCoO$_2$ oriented sintered plates that have the (104) plane parallel to the plate surface are likely to have a polycrystalline structure in the plate thickness direction. For example, a structure is likely to be formed in which two or more crystal grains are joined in the plate thickness direction in such a way that the grains are twisted around an axis extending in the direction perpendicular to the (104) plane while maintaining the direction of the (104) plane in an aligned state. In this case, grain boundaries exists in the plate thickness direction (i.e., grain boundaries cross the view in the plate thickness direction), thus possibly resulting in poor lithium ion conductivity in the plate thickness direction.

The inventors have currently found that, it is possible to provide a LiCoO$_2$ oriented sintered plate having significantly reduced grain boundaries in the plate thickness direction by attaching a Mg-containing compound to a LiCoO$_2$ oriented sintered plate or its precursor, i.e., a Co$_3$O$_4$ oriented sintered plate, followed by firing and other processes. Moreover, the inventors have found that battery performance (in particular, rate characteristics) can be enhanced by using such a LiCoO$_2$ oriented sintered plate as a positive electrode active material in lithium secondary batteries.

Accordingly, an object of the present invention is to manufacture a lithium cobaltate oriented sintered plate that has significantly reduced grain boundaries in the plate thickness direction and that is capable of achieving enhanced battery performance (in particular, rate characteristics) when used as a positive electrode active material in lithium secondary batteries.

According to an aspect of the present invention, there is provided a method for manufacturing a lithium cobaltate oriented sintered plate, wherein at least one of a (104) plane and a (101) plane of LiCoO$_2$ is aligned in parallel with a plate surface, the method comprising the steps of:

(a) providing a green sheet with a thickness of 100 μm or less comprising Co$_3$O$_4$ particles;

(b) firing the green sheet at a temperature of 900 to 1450° C. to obtain a Co$_3$O$_4$ oriented sintered plate, wherein a (h00) plane is aligned in parallel with a sheet surface; and (c) firing the Co$_3$O$_4$ oriented sintered plate in the presence of a lithium source to introduce lithium and thereby form a lithium cobaltate oriented sintered plate composed of LiCoO$_2$, wherein the method further comprises the step of:

(d1) attaching a Mg-containing compound to the Co$_3$O$_4$ oriented sintered plate before the step (c); or (d2) attaching a Mg-containing compound to the lithium cobaltate oriented sintered plate after the step (c) and firing the lithium cobaltate oriented sintered plate having the Mg-containing compound.

DETAILED DESCRIPTION OF THE INVENTION

Figure 1A:
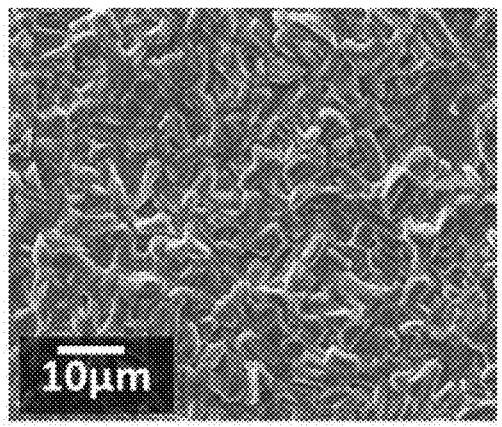
FIG. 1A is an SEM image showing the surface of a LiCoO$_2$ oriented sintered plate produced in Example 1 (comparative).

Method for Manufacturing Lithium Cobaltate Oriented Sintered Plate

The present invention relates to a method for manufacturing a lithium cobaltate oriented sintered plate. The oriented sintered plate manufactured according to the present invention is composed of $LiCoO_2$. $LiCoO_2$ has a layered rock-salt structure, and in the lithium cobaltate oriented sintered plate of the present invention, the (104) plane of $LiCoO_2$ is aligned in parallel with the plate surface. Without departing from the scope of the present invention, the lithium cobaltate oriented sintered plate may further comprise a small amount of one or more elements such as Mg, Al, Si, Ca, Ti, V, Cr, Fe, Cu, Zn, Ga, Ge, Sr, Y, Zr, Nb, Mo, Ag, Sn, Sb, Te, Ba, Bi, Ni, Mn, and W in a doping or equivalent form (for example, in the form of partial solid-state dissolution, segregation, coating, or attachment to the surface layers of crystal grains).

The method for manufacturing a lithium cobaltate oriented sintered plate according to the present invention comprises (a) providing a green sheet comprising $Co_3O_4$ particles; (b) firing the green sheet to form a $Co_3O_4$ oriented sintered plate; and (c) introducing lithium into this $Co_3O_4$ oriented sintered plate to form a lithium cobaltate oriented sintered plate. Also, step (d1) of attaching a Mg-containing compound to the $Co_3O_4$ oriented sintered plate is performed before the above step (c); or step (d2) of attaching the Mg-containing compound to the lithium cobaltate oriented sintered plate and firing the lithium cobaltate oriented sintered plate having the Mg-containing compound is performed after the above step (c). In this way, a $LiCoO_2$ oriented sintered plate can be provided that has significantly reduced grain boundaries in the plate thickness direction by attaching a Mg-containing compound to the $LiCoO_2$ oriented sintered plate or its precursor, i.e., $Co_3O_4$ oriented sintered plate (these may be collectively referred to as an "oriented positive electrode plate" below), followed by firing and other processes. In other words, attaching a Mg-containing compound to the oriented sintered plate and then firing the plate cause crystal growth to occur in such a manner that grain boundaries between highly compatible domains to migrate, and a single-crystal structure or a comparable crystal structure is achieved in the plate thickness direction. It is thus possible to significantly reduce grain boundaries in the plate thickness direction (desirably, such grain boundaries are eliminated). As described above, the presence of grain boundaries in the plate thickness direction may cause poor lithium ion conductivity in the plate thickness direction, and a significant reduction of such grain boundaries yields enhanced lithium ion conductivity in the plate thickness direction. Accordingly, battery performance (in particular, rate characteristics) can be enhanced by using such a $LiCoO_2$ oriented sintered plate as a positive electrode active material in lithium secondary batteries.

The steps of the manufacturing method of the present invention will now be described in detail below.

(a) Provision of Green Sheet

In this step (a), a green sheet with a thickness of 100 μm or less comprising $Co_3O_4$ particles is provided. It is preferable that the green sheet further comprises bismuth oxide (typically $Bi_2O_3$ particles) as a grain growth promoter. The green sheet may be produced by forming a sheet of a raw material comprising $Co_3O_4$ particles and, optionally, bismuth oxide (typically $Bi_2O_3$ particles). The amount of $Bi_2O_3$ particles to be added is not particularly limited, and is preferably 0.1 to 30 wt %, more preferably 1 to 20 wt %, and even more preferably 3 to 10 wt % based on the total amount of $Co_3O_4$ and $Bi_2O_3$ particles. The volume-based D50 particle size of $Co_3O_4$ particles is preferably 0.1 to 2.0 μm and more preferably 0.3 to 1.2 μm. The volume-based D50 particle size of $Bi_2O_3$ particles is preferably 0.1 to 1.0 μm and more preferably 0.2 to 0.5 μm. The thickness of the green sheet is 100 μm or less, preferably 1 to 60 μm, and more preferably 5 to 40 μm. The green sheet may comprise CoO and/or $Co(OH)_2$ particles completely or partially in place of $Co_3O_4$ particles. In this case as well, subjecting such a green sheet to the firing in step (b) can provide a CoO-based firing intermediate or $Co_3O_4$ oriented sintered plate having the (h00) plane aligned in parallel with the sheet surface and, consequently, a lithium cobaltate oriented sintered plate can be produced as in the case of using a green sheet comprising $Co_3O_4$ particles.

Examples of methods for forming the green sheet include (i) a doctor blade method using a slurry containing raw material particles; (ii) a drum dryer method in which a slurry containing a raw material is applied to a heated drum, and the dried material is scraped off with a scraper; (iii) a disc dryer method in which a slurry is applied to a heated disc surface, and the dried material is scraped off with a scraper; (iv) a method in which hollow granules are obtained as a sheet-like curved green body by suitably adjusting spray dryer conditions; (v) an extrusion method using a mixture containing raw material particles; and other such methods. A particularly preferable sheet formation method is a doctor blade method. In the case of using a doctor blade method, a green sheet may be produced by applying a slurry to a flexible plate (e.g., an organic polymer plate such as PET film), drying and solidifying the applied slurry to form a green body, and separating this green body from the plate. When a slurry or mixture is prepared before green body formation, inorganic grains may be dispersed in a dispersion medium, and a binder, plasticizer, or the like may be suitably added. It is preferable to prepare the slurry so as to have a viscosity of 500 to 4000 cP, and is preferable to defoam the slurry under reduced pressure. From the viewpoint of avoiding wrinkles resulting from firing shrinkage, the green sheet may have a circular shape.

(b) Production of $Co_3O_4$ Oriented Sintered Plate

In this step (b), the green sheet is fired at a temperature of 900 to 1450° C. to obtain a $Co_3O_4$ oriented sintered plate, wherein the (h00) plane is aligned in parallel with the sheet surface. $Co_3O_4$ particles before being fired have an isotropic form and, therefore, the green sheet does not initially have orientation. Firing causes $Co_3O_4$ particles to undergo phase transformation into CoO, and orientation is induced in the grain growth stage (which will be referred to as the orientation and grain growth of CoO below). At this time, a firing intermediate is temporarily formed in which CoO derived from $Co_3O_4$ particles have a (h00) plane (h is any integer, such as h=2) aligned in parallel with the sheet surface. That is, the Co oxide having a spinel structure represented by $Co_3O_4$ at room temperature undergoes phase transformation to have a rock-salt structure represented by CoO at 900° C. or higher (for example, 920° C. or higher). This firing reduces $Co_3O_4$ and causes phase transformation into CoO as well as the densification of a sheet. Then, during the cooling stage of the firing intermediate after firing, CoO is oxidized back to $Co_3O_4$. At this time, the orientation of CoO is inherited by $Co_3O_4$, thus forming an oriented sintered plate composed of numerous $Co_3O_4$ grains oriented such that the (h00) plane is aligned in parallel with the sheet surface. In particular, the orientation and grain growth of CoO is facilitated by the presence of bismuth oxide (typically $Bi_2O_3$). When the green sheet contains bismuth oxide, bismuth volatilizes during firing and disappears from the sheet.

The firing temperature of the green sheet is 900 to 1450° C. (for example, 900 to 1350° C.), preferably 1000 to 1400° C. (for example, 1000 to 1300° C.), and more preferably 1100 to 1400° C. (for example, 1100 to 1300° C.). The green sheet is fired at the above firing temperature preferably for 1 to 20 hours and more preferably for 2 to 10 hours. The cooling rate after firing is, for example, preferably 10 to 200° C./h and more preferably 20 to 100° C./h.

A green sheet thickness of 100 µm or less contributes to the orientation and grain growth of CoO. That is, in the green sheet having a thickness of 100 µm or less, the amount of materials existing in the thickness direction is much smaller than the amount of materials existing in the in-plane direction of the sheet (the direction perpendicular to the thickness direction). Therefore, at the initial stage when there are multiple grains in the thickness direction, grains grow in random directions. Once the materials existing in the thickness direction are consumed as grain growth progresses, the direction of grain growth is limited to the two-dimensional directions in the sheet plane (hereinafter referred to as the plane direction), thereby reliably promoting the grain growth in the plane direction. In particular, the grain growth in the plane direction can be facilitated by forming a green sheet as thinly as possible (e.g. several µm or less). Alternatively, the grain growth in the plane direction can be facilitated by promoting the grain growth to the utmost extent even though the green sheet is relatively thick (up to about 100 µm, e.g., about 20 µm). In either case, only the grains that have a crystal plane with the lowest surface energy in the green sheet plane grow selectively in the plane direction in a flat manner (a plate-like manner) during firing. Consequently, a firing intermediate is obtained by firing the green sheet, in which CoO plate-like crystal grains having a large aspect ratio and having the (h00) plane aligned in parallel with the plate surface of the grains are two-dimensionally joined at grain boundary portions such that the (h00) plane is parallel to the sheet surface. Then, as described above, CoO is oxidized to $Co_3O_4$ which inherits the crystal orientation during the cooling stage of the firing intermediate, thus forming an oriented sintered plate composed of numerous $Co_3O_4$ grains in which the (h00) plane is aligned in parallel with the sheet surface. CoO grains are basically single-crystalline in the plate thickness direction, but are likely to adopt a polycrystalline structure when oxidized to $Co_3O_4$. For example, a structure is likely to be formed in which two or more crystal grains are joined in the plate thickness direction in such a way that the grains are twisted around an axis extending in the direction perpendicular to the (h00) plane while maintaining the direction of the (h00) plane in an aligned state. The initial raw material particle size (D50) of $Co_3O_4$ greatly contributes to the grain growth of CoO. The volume-based D50 particle size of the initial raw material of $Co_3O_4$ is preferably 0.05 µm to 5.0 µm, more preferably 0.1 µm to 2.0 µm, more preferably 0.2 µm to 1.0 µm, and even more preferably 0.2 µm to 0.5 µm. A smaller particle size is more likely to facilitate grain growth but, on the other hand, an excessively small particle size results in a low initial tape density, and grain growth is less likely to progress. The particle size of $Co_3O_4$ may be adjusted by grinding. Such grinding is performing by a technique that is unlikely to allow contamination, such as jet-milling.

The oriented sintered plate composed of numerous $Co_3O_4$ grains is an independent plate-like sheet. The "independent" sheet refers to a sheet that can be handled after being fired as a single body independently of a support. That is, the "independent" sheet does not encompass a sheet integrated with (inseparable from or difficult to separate from) a support (such as a substrate) into a single body due to firing. In this way, a self-supporting oriented sintered plate can be obtained in which numerous grains are joined such that the (h00) plane is aligned in parallel with the plate surface of grains. This self-supporting plate can be a dense ceramic sheet in which such numerous grains are joined without any space therebetween.

(c) Introduction of Lithium

In step (c), the $Co_3O_4$ oriented sintered plate is fired in the presence of a lithium source to introduce lithium and thereby form a lithium cobaltate oriented sintered plate composed of $LiCoO_2$. It is preferable to introduce lithium by allowing the $Co_3O_4$ oriented sintered plate to react with a lithium compound. Examples of lithium compounds for lithium introduction include (i) lithium hydroxide; (ii) various lithium salts such as lithium carbonate, lithium nitrate, lithium acetate, lithium chloride, lithium oxalate, and lithium citrate; (iii) various lithium alkoxides such as lithium methoxide and lithium ethoxide; and the like. Particularly preferable lithium compounds are lithium hydroxide, lithium carbonate, and mixtures thereof. Conditions of the lithium introduction, such as the mixing ratio, heating temperature, heating time, and atmosphere, are not particularly limited, and are suitably set in consideration of the melting point, decomposition temperature, reactivity, and such features of a material used as a lithium source. For example, lithium can be introduced into $Co_3O_4$ grains by applying a predetermined amount of a slurry of LiOH powder to the $Co_3O_4$ oriented sintered plate, then drying the slurry, and heating the sintered plate. As another method, lithium can be introduced into $Co_3O_4$ grains by placing a predetermined amount of lithium carbonate on the (h00) plane-oriented $Co_3O_4$ oriented sintered plate and heating the sintered plate. Placement of lithium carbonate may be executed such that lithium carbonate in the form of a lithium-containing sheet is placed on a green body sheet, and may also be executed such that the $Co_3O_4$ oriented sintered plate is sandwiched between lithium-containing sheets from above and below. The heating temperature at this time is preferably 600 to 980° C. (for example, 600 to 880° C.), and heating is performed at a temperature within this range preferably for 2 to 20 hours. The heating atmosphere is preferably an oxidizing atmosphere such as $O_2$ or air. In particular, when heat treatment is performed at 900° C. or higher, an atmosphere having a higher oxygen concentration than air is preferable. The lithium compound to be adhered to the $Co_3O_4$ oriented sintered plate is preferably in such an amount that the Li/Co ratio is 1.0 or greater, and more preferably 1.0 to 1.5. Too much Li is not problematic because excessive Li volatilizes and disappears as heating is performed. In order to increase the flatness of the lithium cobaltate oriented sintered plate (for example, in order to suppress the irregularities of the plate surface), the $Co_3O_4$ oriented sintered plate may be heated under load. In order to sufficiently supply oxygen necessary for synthesis to the plate surface of the $Co_3O_4$ oriented sintered plate, a porous setter or a setter having openings (such as a honeycomb-like setter) may be used as a load. In the case of a relatively thick lithium cobaltate oriented sintered plate (for example, a thickness of 30 μm or greater), the Li raw material attached with high volume is likely to result in insufficient synthesis because a part of the Li raw material tends to melt and flow out during the heating stage without being used for synthesis. Accordingly, lithium may be introduced multiple times. Performing the lithium introduction step multiple times provides effects that the aforementioned insufficient synthesis can be avoided, and/or the size of primary particles is increased, and crystallinity is improved.

In the lithium cobaltate oriented sintered plate obtained in this way, the (104) plane of $LiCoO_2$ is aligned in parallel with the plate surface. Thus, the (104) plane through which lithium ions are favorably intercalated and deintercalated is aligned in parallel with the plate surface of the oriented sintered plate. Accordingly, when this oriented sintered plate is used as a positive electrode active material to make a battery, the (104) plane is more exposed to (more in contact with) electrolytes. Further, the proportion of the exposed (003) plane (the plane unsuitable for intercalation and deintercalation of lithium ions) at the surface of grains and the plate is extremely small. Therefore, for example, when the lithium cobaltate oriented sintered plate is used as a positive electrode material of solid-state lithium secondary batteries, a high capacity and a high level of rate characteristics can be simultaneously achieved. The thickness of the lithium cobaltate oriented sintered plate is preferably 5 to 75 μm, more preferably 10 to 60 μm, and particularly preferably 20 to 50 μm. The size of the lithium cobaltate oriented sintered plate is preferably 5 mm×5 mm square or greater, more preferably 10 mm×10 mm to 100 mm×100 mm square, and even more preferably 10 mm×10 mm to 50 mm×50 mm square, or in other words, is preferably 25 $mm^2$ or greater, more preferably 100 to 10000 $mm^2$, and even more preferably 100 to 2500 $mm^2$.

For the synthesis of the oriented plate, a technique may be used in which a lithium cobaltate oriented sintered plate obtained in advance is used as a template to grow lithium cobaltate on this template as a starting point. According to this technique involving a template, a lithium cobaltate oriented sintered plate with fewer grain boundaries can be produced. For example, the lithium cobaltate oriented sintered plate can be obtained by mixing a lithium cobaltate oriented sintered body plate having a size of 30 μm×30 μm×5 μm synthesized by the above technique with non-oriented lithium cobaltate particles having a particle size of 0.5 μm in a weight ratio of about 10:90, and then tape-casting and firing the mixture. Also, the lithium cobaltate oriented sintered plate can be similarly obtained as above by using a $Co_3O_4$ oriented sintered plate as a template in place of the lithium cobaltate oriented sintered plate.

(d) Mg Coating Treatment

This step (d) (i.e., step (d1) and (d2)) is the step of attaching a Mg-containing compound to the oriented sintered plate and, as necessary, firing the oriented sintered plate. Step (d) may be performed as step (d1) before step (c) or may be performed as step (d2) after step (c). Specifically, in the case where the attachment of a Mg-containing compound is performed before step (c), the subsequent firing can be performed by way of the firing in step (c). On the other hand, in the case where the attachment of a Mg-containing compound is performed after step (c), firing is separately performed thereafter. That is, step (d) may be performed by way of either step (d1) in which a Mg-containing compound is attached to the $Co_3O_4$ oriented sintered plate before step (c), or step (d2) in which a Mg-containing compound is attached to the lithium cobaltate oriented sintered plate after step (c), and the lithium cobaltate oriented sintered plate having the Mg-containing compound is fired.

The Mg-containing compound is preferably a compound capable of providing MgO by being fired. Preferable examples of the Mg-containing compound include magnesium acetate, magnesium nitrate, magnesium chloride, magnesium hydroxide, magnesium carbonate, magnesium sulfate, magnesium diethoxide, and any combination thereof, with magnesium acetate being particularly preferable.

The Mg-containing compound is preferably supplied in at least one form selected from the group consisting of a solution or slurry comprising the Mg-containing compound, a sheet comprising the Mg-containing compound, and a powder of the Mg-containing compound, and more preferably in the form of an aqueous solution comprising the Mg-containing compound (for example, an aqueous magnesium acetate solution). The attachment of the Mg-containing compound to the oriented sintered plate may be suitably performed by a known technique selected according to the form of the Mg-containing compound supplied. For example, in the case of a solution or slurry form, the oriented sintered body may be immersed in a solution or slurry comprising the Mg-containing compound and then dried, or such a solution or slurry may be applied to the oriented sintered body, followed by drying. In this case, the concentration of an aqueous solution comprising the Mg-containing compound (for example, an aqueous magnesium acetate solution) is not particularly limited, and is preferably 0.01 to 2 mol/L and more preferably 0.05 to 1 mol/L. In the case of a sheet form, a sheet comprising the Mg-containing compound may be placed on the oriented sintered body. In the case of a powder form, a powder of the Mg-containing compound may be placed as-is, or may be placed after being formed into a paste, on the oriented sintered body. No matter which technique is used, the amount of Mg-containing compound attached to the oriented sintered body is not particularly limited and, for example, is preferably such a small amount that the desired effects are obtained without deteriorating the basic $LiCoO_2$ composition that constitutes the oriented sintered body. For example, the amount is preferably 0.01 to 5 mol % and more preferably 0.05 to 2 mol % relative to $LiCoO_2$. Moreover, another compound may be added simultaneously with the Mg-containing compound and, for example, the simultaneous addition of Li further enhances the effects. The existence form of Li is not particularly limited and, for example, lithium hydroxide or lithium carbonate may be supplied in any of the aqueous solution, powder, or tape form.

Firing in step (d2) is performed preferably at a firing temperature of 400 to 950° C., preferably 500 to 950° C., more preferably 500 to 900° C., and even more preferably 600 to 900° C. This firing is performed at the above firing temperature preferably for 1 to 20 hours and more preferably for 2 to 10 hours. The firing atmosphere is not particularly limited, and may be performed in an oxidizing atmosphere such as air.

As described above, without departing from the scope of the present invention, the lithium cobaltate oriented sintered plate may further comprise one or more elements such as Mg, Al, Si, Ca, Ti, V, Cr, Fe, Cu, Zn, Ga, Ge, Sr, Y, Zr, Nb, Mo, Ag, Sn, Sb, Te, Ba, Bi, Ni, Mn, and W, and such elements may be added in any of the above-described steps (a) to (d) (typically, step (a) or step (c)). In the case of segregating an additional element only on the surface of the plate or only attaching an additional element thereto, the plate may be coated with such an additional element and then heat-treated, for example, after step (c) or step (d2).

For the synthesis of the oriented plate, a technique may be used in which the MgO-added lithium cobaltate oriented sintered plate obtained in advance is used as a template to grow lithium cobaltate on this template as a starting point. According to this technique involving a template, a lithium cobaltate oriented sintered plate with fewer grain boundaries can be produced. For example, a lithium cobaltate oriented sintered plate can be obtained by mixing a MgO-added lithium cobaltate oriented sintered body plate having a size of 30 μm×30 μm×5 μm synthesized by the above technique with non-oriented lithium cobaltate particles having a particle size of 0.5 μm in a weight ratio of about 10:90, and then tape-casting and firing the mixture.

EXAMPLES

The present invention will now be more specifically described by way of the following Examples.

Example 1 (Comparative)

(1) Production of LiCoO$_2$ Oriented Sintered Plate

As a comparative example, a LiCoO$_2$ oriented sintered plate was produced without the attachment of a Mg-containing compound according to the following procedure.

(1a) Production of Green Sheet

Bi$_2$O$_3$ (a volume-based D50 particle size of 0.3 μm, manufactured by Taiyo Koko Co., Ltd.) was added to a Co$_3$O$_4$ raw material powder (a volume-based D50 particle size of 0.3 μm, manufactured by Seido Chemical Industry Co., Ltd.) in a proportion of 10 wt % to provide a mixed powder. 100 parts by weight of this mixed powder, 100 parts by weight of a dispersion medium (toluene:isopropanol=1:1), 10 parts by weight of a binder (polyvinyl butyral: lot number BM-2, manufactured by Sekisui Chemical Co., Ltd.), 4 parts by weight of a plasticizer (DOP: Di(2-ethylhexyl) phthalate, manufactured by Kurogane Kasei Co., Ltd.), and 2 parts by weight of a dispersing agent (under the product name of Rheodol SP-O30, manufactured by Kao Corporation) were mixed. This mixture was defoamed by being stirred under reduced pressure, and the viscosity was adjusted to 4000 cP. The viscosity was measured with an LVT viscometer manufactured by Brookfield. A green sheet was obtained by forming the slurry produced as above into a sheet on a PET film by a doctor blade method so as to have a dry thickness of 24 μm.

(1b) Production of Oriented Sintered Plate

The green sheet separated from the PET film was cut into a sample having 50 mm square by a cutter, placed in the center of an embossed zirconia setter (with a size of 90 mm square and a height of 1 mm) having 300 μm protrusions, fired at 1300° C. for 5 hours and then cooled at a cooling rate of 50° C./h, and a portion that was not fused to the setter was taken off as a Co$_3$O$_4$ oriented sintered plate.

(1c) Lithium Introduction

LiOH.H$_2$O powder (manufactured by Wako Pure Chemical Industries, Ltd.) was ground with a jet mill to 1 μm or less and dispersed in ethanol to form a slurry. This slurry was applied to the Co$_3$O$_4$ oriented sintered plate so as to have Li/Co=1.3 and dried. Thereafter, heat treatment was performed in air at 840° C. for 10 hours to provide a LiCoO$_2$ oriented sintered plate.

(2) Evaluations

The LiCoO$_2$ oriented sintered plate thus produced was evaluated as follows.

(2a) Examination of Orientation by XRD Measurement

The LiCoO$_2$ oriented sintered plate was subjected to XRD (X-ray diffraction) measurement to examine whether the (104) plane was aligned in parallel with the plate surface. Specifically, an XRD profile when irradiating the surface of the sintered plate with X rays was obtained using an XRD apparatus (manufactured by Rigaku Corporation, Geiger Flex RAD-IB). The ratio of the diffraction intensity (peak height) of the (003) plane to that of the (104) plane, i.e., $I_{[003]}/I_{[104]}$, was calculated to be 0.3 from this XRD profile. On the other hand, the ratio $I_{[003]}/I_{[104]}$ was 1.6 after the same plate was sufficiently ground with a mortar into a powder to obtain a powder XRD profile. It was thus verified that numerous (104) planes existed in parallel with the plate surface, i.e., were oriented. The half width of the peak of the (104) plane was determined by pattern fitting the XRD profile.

(2b) SEM Observation

Figure 1B:
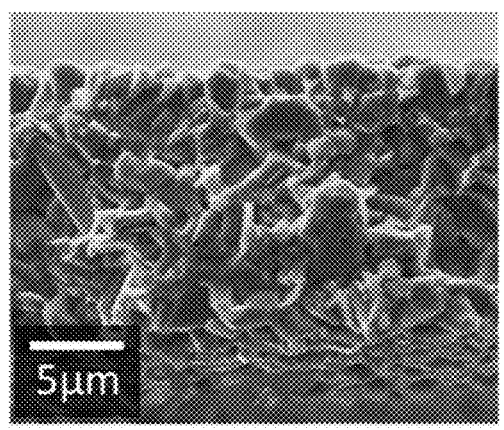
FIG. 1B is an SEM image showing the fractured surface of a LiCoO$_2$ oriented sintered plate produced in Example 1 (comparative).

The surface and the fractured surface of the LiCoO$_2$ oriented sintered plate were observed using a scanning electron microscope (SEM, JSM-6610LV, manufactured by JEOL) at an accelerating voltage of 10 to 20 kV. The resulting SEM image of the surface is shown in FIG. 1A, and the SEM image of the fractured surface is shown in FIG. 1B.

(2c) Production and Evaluation of Battery

A positive electrode was produced by fixing the LiCoO$_2$ oriented sintered plate to a stainless-steel current collector using an epoxy-based electroconductive adhesive in which electroconductive carbon was dispersed. The produced positive electrode, a negative electrode composed of a Li metal plate, and a separator were arranged in the order of positive electrode-separator-negative electrode, and this laminate was filled with an electrolytic solution to provide a coin cell. The electrolytic solution was prepared by dissolving LiPF$_6$ to provide a concentration of 1 mol/L in an organic solvent prepared by mixing ethylene carbonate (EC) with an equal volume of diethyl carbonate (DEC).

Using the battery (coin cell) produced in the above-described manner, the battery capacity (discharge capacity) and the rate capacity retention ratio were evaluated. (i)

Constant current charge was performed at a current value of 0.1 C rate until the cell voltage reached 4.2 V, then (ii) constant voltage charge was performed under current conditions where the cell voltage was maintained at 4.2 V until the current value dropped to 1/20, followed by pausing for 10 minutes, and subsequently (iii) constant current discharge was performed at a current value of 0.1 C rate until the cell voltage reached 3.0 V, followed by pausing for 10 minutes. The same charge/discharge as (i) to (iii) above was repeated again except that the discharge rate was 1 C. This sequence of operations was regarded as one cycle, and repeated a total of three times at 25° C. The value obtained by dividing the 1 C discharge capacity at the third cycle by the 0.1 C discharge capacity also at the third cycle was regarded as a rate capacity retention ratio. Results were as shown in Table 1.

Example 2

Figure 2A:
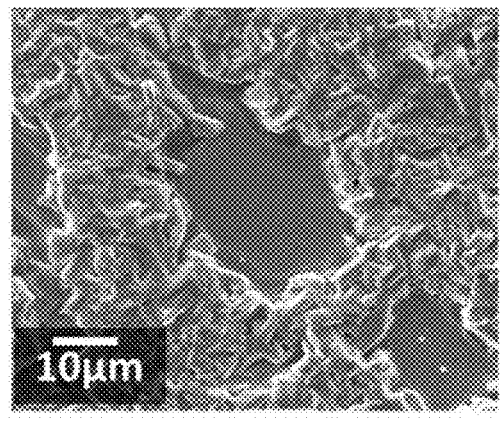
FIG. 2A shows an SEM image showing the surface of a LiCoO$_2$ oriented sintered plate that was Mg-coated in Example 2.
Figure 2B:
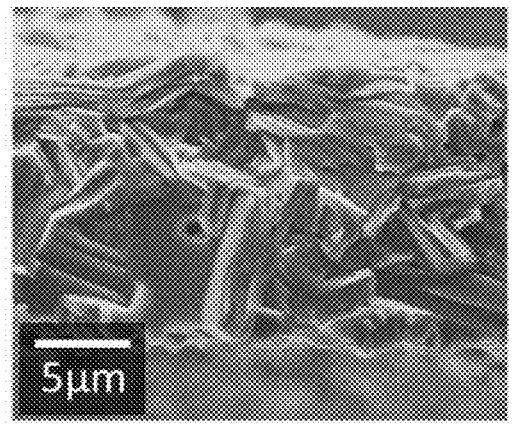
FIG. 2B shows an SEM image showing the fractured surface of a LiCoO$_2$ oriented sintered plate that was Mg-coated in Example 2.

The $LiCoO_2$ oriented sintered plate produced in Example 1 was immersed in a 0.5 mol/L aqueous magnesium acetate solution and then dried. The resulting magnesium acetate-attached $LiCoO_2$ oriented sintered plate was heat-treated at 500° C. for 5 hours in air to provide a Mg-coated $LiCoO_2$ oriented sintered plate. This $LiCoO_2$ oriented sintered plate was evaluated as in Example 1. Consequently, an XRD profile nearly identical to Example 1 was obtained, and it was thus verified that numerous (104) planes existed in parallel with the plate surface, i.e., were oriented. FIG. 2A shows an SEM image of the Mg-coated $LiCoO_2$ oriented sintered plate, and FIG. 2B shows an SEM image of its fractured surface. It can be understood from these SEM images that the Mg-coated $LiCoO_2$ oriented sintered plate has markedly fewer grain boundaries than the $LiCoO_2$ oriented sintered plate of Example 1. As shown in Table 1, the rate capacity retention ratio as well is markedly higher than that of the $LiCoO_2$ oriented sintered plate of Example 1. Moreover, the (104) peak half width is also improved, i.e., crystallinity is higher, than that of Example 1.

Example 3

Figure 3A:
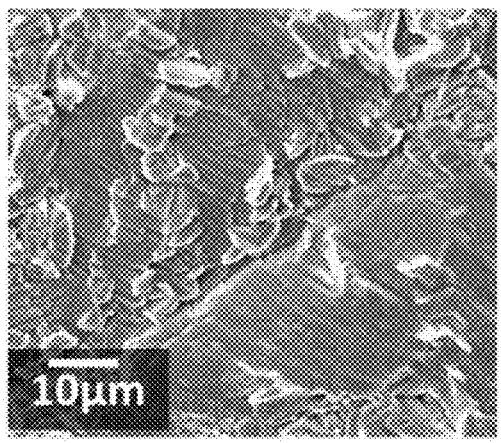
FIG. 3A shows an SEM image showing the surface of a LiCoO$_2$ oriented sintered plate that was Mg-coated in Example 3.
Figure 3B:
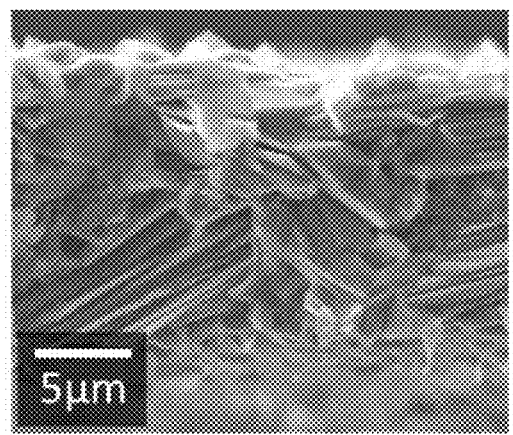
FIG. 3B shows an SEM image showing the fractured surface of a LiCoO$_2$ oriented sintered plate that was Mg-coated in Example 3.

The $LiCoO_2$ oriented sintered plate produced in Example 1 was immersed in a 0.5 mol/L aqueous magnesium acetate solution and then dried. The resulting magnesium acetate-attached $LiCoO_2$ oriented sintered plate was heat-treated at 700° C. for 5 hours in air to provide a Mg-coated $LiCoO_2$ oriented sintered plate. This $LiCoO_2$ oriented sintered plate was evaluated as in Example 1. Consequently, an XRD profile nearly identical to Example 1 was obtained, and it was thus verified that numerous (104) planes existed in parallel with the plate surface, i.e., were oriented. FIG. 3A shows an SEM image of the Mg-coated $LiCoO_2$ oriented sintered plate, and FIG. 3B shows an SEM image of its fractured surface. It can be understood from these SEM images that the Mg-coated $LiCoO_2$ oriented sintered plate has markedly fewer grain boundaries than the $LiCoO_2$ oriented sintered plate of Example 1. As shown in Table 1, the rate capacity retention ratio as well is markedly higher than that of the $LiCoO_2$ oriented sintered plate of Example 1. Moreover, the (104) peak half width is also improved, i.e., crystallinity is higher, than that of Example 1.

Example 4

Figure 4A:
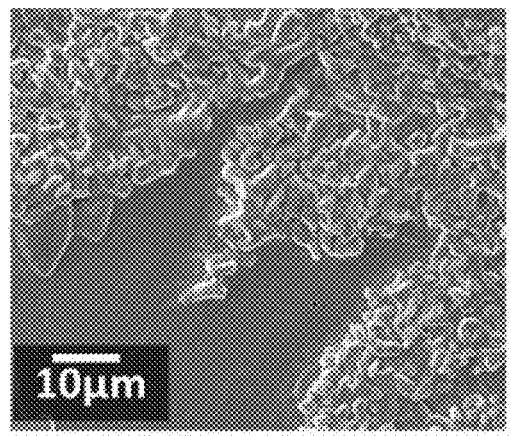
FIG. 4A shows an SEM image showing the surface of a LiCoO$_2$ oriented sintered plate that was Mg-coated in Example 4.
Figure 4B:
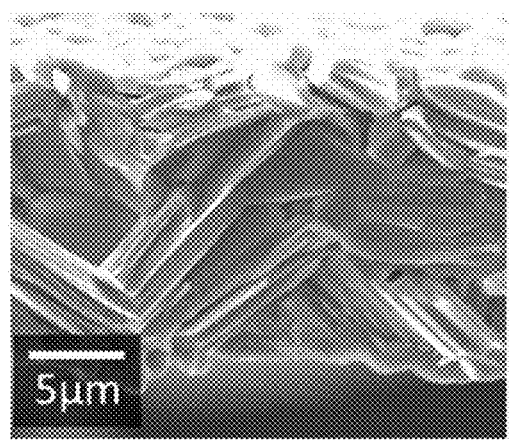
FIG. 4B shows an SEM image showing the fractured surface of a $LiCoO_2$ oriented sintered plate that was Mg-coated in Example 4.

The $LiCoO_2$ oriented sintered plate produced in Example 1 was immersed in a 0.5 mol/L aqueous magnesium acetate solution and then dried. The resulting magnesium acetate-attached $LiCoO_2$ oriented sintered plate was heat-treated at 900° C. for 5 hours in air to provide a Mg-coated $LiCoO_2$ oriented sintered plate. This $LiCoO_2$ oriented sintered plate was evaluated as in Example 1. Consequently, an XRD profile nearly identical to Example 1 was obtained, and it was thus verified that numerous (104) planes existed in parallel with the plate surface, i.e., were oriented. FIG. 4A shows an SEM image of the Mg-coated $LiCoO_2$ oriented sintered plate, and FIG. 4B shows an SEM image of its fractured surface. It can be understood from these SEM images that the Mg-coated $LiCoO_2$ oriented sintered plate has markedly fewer grain boundaries than the $LiCoO_2$ oriented sintered plate of Example 1. In particular, as shown in Table 1, the rate capacity retention ratio is markedly higher than not only the rate capacity retention ratio of the $LiCoO_2$ oriented sintered plate of Example 1 but also the rate capacity retention ratios of the $LiCoO_2$ oriented sintered plates of Examples 2 and 3. Moreover, the (104) peak half width is also improved, i.e., crystallinity is higher, than not only the (104) peak half width of Example 1 but also the (104) peak half widths of Examples 2 and 3.

Example 5

(a) Production of Green Sheet

A slurry for green sheet production as prepared in Example 1 was formed into a sheet on a PET film by a doctor blade method so as to have a thickness after drying of 55 μm to provide a green sheet.

(b) Production of Oriented Sintered Plate

The green sheet separated from the PET film was cut into a sample having 50 mm square by a cutter, placed in the center of an embossed zirconia setter (with a size of 90 mm square and a height of 1 mm) having 300 μm protrusions, fired at 1400° C. for 5 hours and then cooled at a cooling rate of 50° C./h, and a portion that was not fused to the setter was taken off as a $Co_3O_4$ oriented sintered plate.

(c) Lithium Introduction $LiOH.H_2O$ powder (manufactured by Wako Pure Chemical Industries, Ltd.) was ground with a jet mill to 1 μm or less and dispersed in ethanol to form a slurry. This slurry was applied to the $Co_3O_4$ oriented sintered plate so as to have Li/Co=1.3 and dried. Thereafter, heat treatment was performed in $O_2$ at 900° C. for 10 hours, and this treatment was repeated two more times, to provide a $LiCoO_2$ oriented sintered plate.

(d) Mg Coating Treatment

Figure 5A:
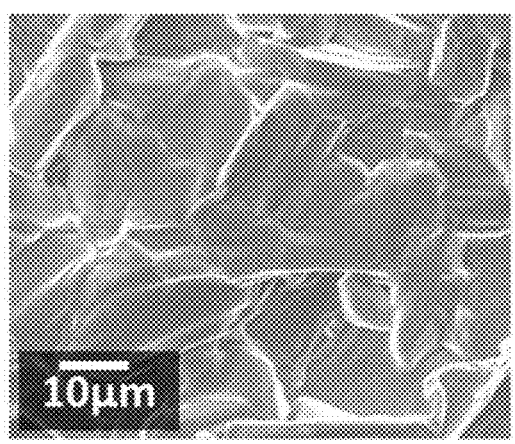
FIG. 5A shows an SEM image showing the surface of a $LiCoO_2$ oriented sintered plate that was Mg-coated in Example 5.
Figure 5B:
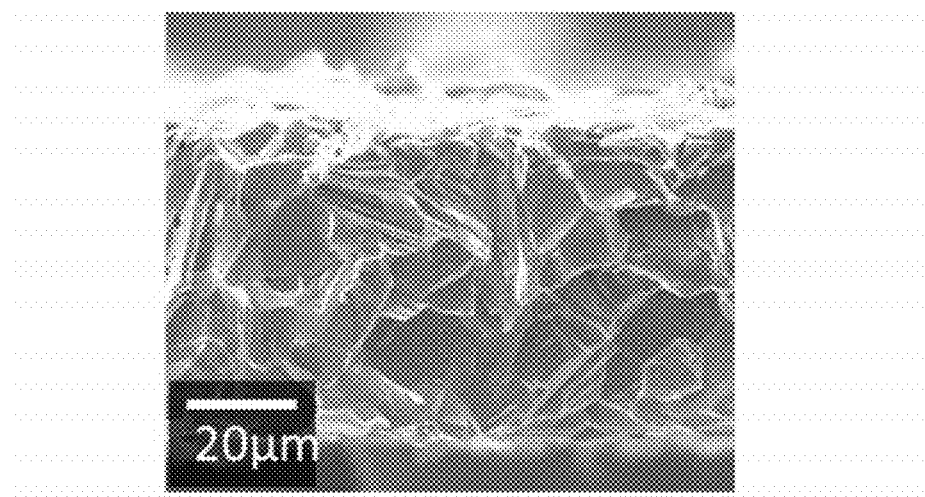
FIG. 5B shows an SEM image showing the fractured surface of a $LiCoO_2$ oriented sintered plate that was Mg-coated in Example 5.

The same treatment as in Example 4 was performed on the resulting $LiCoO_2$ oriented sintered plate to provide a Mg-coated $LiCoO_2$ oriented sintered plate. This $LiCoO_2$ oriented sintered plate was evaluated as in Example 1. Consequently, an XRD profile nearly identical to Example 1 was obtained, and it was thus verified that numerous (104) planes existed in parallel with the plate surface, i.e., were oriented. FIG. 5A shows an SEM image of the Mg-coated $LiCoO_2$ oriented sintered plate, and FIG. 5B shows an SEM image of its fractured surface. It can be understood from these SEM images that the Mg-coated $LiCoO_2$ oriented sintered plate has markedly fewer grain boundaries than the $LiCoO_2$ oriented sintered plate of Example 1. In particular, as shown in Table 1, the rate capacity retention ratio is markedly higher than not only the rate capacity retention ratio of the LiCoO$_2$ oriented sintered plate of Example 1 but also the rate capacity retention ratios of the LiCoO$_2$ oriented sintered plates of Examples 2 and 3. Moreover, the (104) peak half width is also improved, i.e., crystallinity is higher, than not only the (104) peak half width of Example 1 but also the (104) peak half widths of Examples 2 and 3.

TABLE 1

|  | Mg coating treatment | Firing temperature in Mg coating treatment | Half width of the (104) Peak | Rate capacity retention ratio (1 C/0.1 C) |
|---|---|---|---|---|
| Ex. 1 (comparative) | Not performed | Not applicable | 0.20 | 50% |
| Ex. 2 | Performed | 500° C. | 0.18 | 65% |
| Ex. 3 | Performed | 700° C. | 0.17 | 75% |
| Ex. 4 | Performed | 900° C. | 0.16 | 90% |
| Ex. 5 | Performed | 900° C. | 0.16 | 85% |

What is claimed is:

1. A method for manufacturing a lithium cobaltate oriented sintered plate, wherein at least one of a (104) plane and a (101) plane of LiCoO$_2$ is aligned in parallel with a plate surface, the method comprising the steps of:
   (a) providing a green sheet with a thickness of 100 μm or less comprising Co$_3$O$_4$ particles;
   (b) firing the green sheet at a temperature of 900 to 1450° C. to obtain a Co$_3$O$_4$ oriented sintered plate, wherein a (h00) plane is aligned in parallel with a sheet surface; and
   (c) firing the Co$_3$O$_4$ oriented sintered plate in the presence of a lithium source to introduce lithium and thereby form the lithium cobaltate oriented sintered plate composed of LiCoO$_2$, the method further comprising the step of:
   (d1) attaching a Mg-containing compound to the Co$_3$O$_4$ oriented sintered plate before the step (c); or
   (d2) attaching a Mg-containing compound to the lithium cobaltate oriented sintered plate after the step (c) and firing the lithium cobaltate oriented sintered plate having the Mg-containing compound.

2. The method according to claim 1, wherein the Mg-containing compound is a compound capable of providing MgO by being fired.

3. The method according to claim 1, wherein the Mg-containing compound is at least one selected from the group consisting of magnesium acetate, magnesium nitrate, magnesium chloride, magnesium hydroxide, magnesium carbonate, magnesium sulfate, and magnesium diethoxide.

4. The method according to claim 1, wherein the Mg-containing compound is supplied in at least one form selected from the group consisting of a solution or slurry comprising the Mg-containing compound, a sheet comprising the Mg-containing compound, and a powder of the Mg-containing compound.

5. The method according to claim 1, wherein the Mg-containing compound is provided in the form of an aqueous solution comprising the Mg-containing compound.

6. The method according to claim 5, wherein the Mg-containing compound is magnesium acetate.

7. The method according to claim 1, wherein firing in the step (d2) is performed at a firing temperature of 400 to 950° C.

8. The method according to claim 1, wherein the raw material powder further comprises bismuth oxide.

9. The method according to claim 1, wherein firing in the step (c) is performed at a temperature of 600 to 980° C.

10. The method according to claim 1, wherein firing in the step (b) is performed at a temperature of 900 to 1350° C.

* * * * *